(12) United States Patent
Hishinuma

(10) Patent No.: US 6,507,073 B1
(45) Date of Patent: Jan. 14, 2003

(54) MOS SEMICONDUCTOR DEVICE WITH BREAKDOWN VOLTAGE PERFORMANCE AND METHOD FOR MANUFACTURING THE SAME

(75) Inventor: Kuniyuki Hishinuma, Tochigi-ken (JP)

(73) Assignee: Nippon Precision Circuits Inc., Tokyo (JP)

( * ) Notice: Subject to any disclaimer, the term of this patent is extended or adjusted under 35 U.S.C. 154(b) by 0 days.

(21) Appl. No.: 09/724,171

(22) Filed: Nov. 28, 2000

(30) Foreign Application Priority Data

Dec. 10, 1999 (JP) .......................................... 11-351976

(51) Int. Cl.[7] ............................................. H01L 23/62
(52) U.S. Cl. ....................... 257/356; 257/316; 257/330; 257/331; 257/341
(58) Field of Search ................................ 257/330, 356, 257/316, 331, 341

(56) References Cited

U.S. PATENT DOCUMENTS

| | | | | |
|---|---|---|---|---|
| 5,036,375 A | * | 7/1991 | Mitchell ..................... 357/235 |
| 5,373,178 A | * | 12/1994 | Motoyoshi et al. .......... 257/344 |
| 5,407,841 A | * | 4/1995 | Liao et al. ..................... 437/31 |
| 5,747,851 A | * | 5/1998 | Tomatsu et al. ............. 257/330 |
| 6,127,696 A | * | 10/2000 | Sery et al. ................... 257/207 |

* cited by examiner

Primary Examiner—Richard Elms
Assistant Examiner—Doug Menz
(74) Attorney, Agent, or Firm—Jordan and Hamburg LLP

(57) ABSTRACT

MOS semiconductor device including a substrate having source and drain regions laterally spaced from one another and a channel therebetween, a gate electrode over the channel and an oxide layer. The oxide layer includes a gate oxide layer between the gate electrode and the substrate, an oxide film having a having a thickness greater than a thickness of the gate oxide layer and a boundary oxide layer between the gate oxide layer and oxide film. The boundary oxide layer has a thickness between the thickness of the gate oxide layer and the thickness of the oxide film. The oxide film boundary oxide layer are formed by selective oxidation before formation of the gate electrode. The gate electrode has end portions extending over a portion of the oxide film while receiving no distortion from the boundary oxide layer to thereby improve breakdown voltage performance at the end portions of the gate electrode.

20 Claims, 2 Drawing Sheets

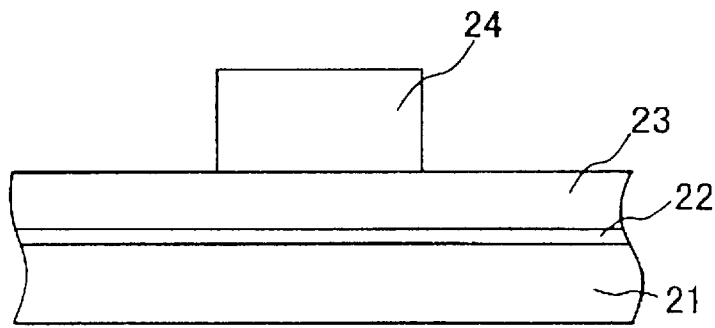
FIG. 2A
PRIOR ART
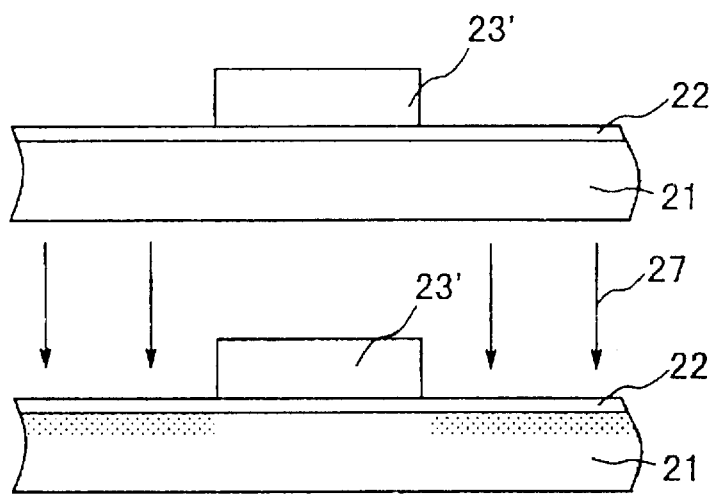
FIG. 2B
PRIOR ART
FIG. 2C
PRIOR ART
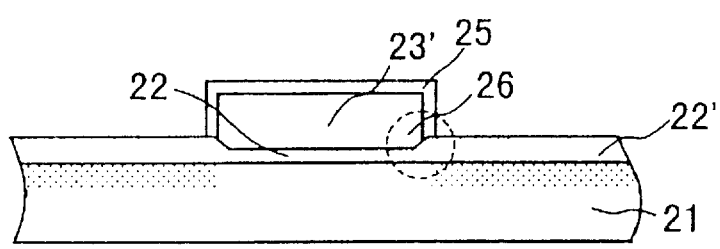
FIG. 2D
PRIOR ART
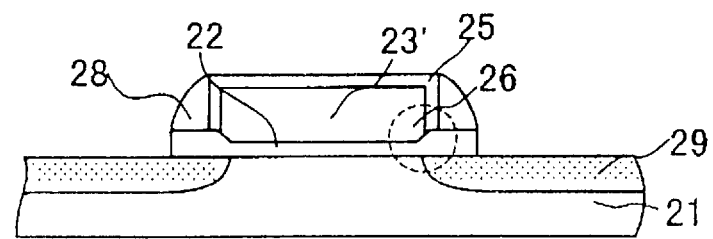
FIG. 2E
PRIOR ART

MOS SEMICONDUCTOR DEVICE WITH BREAKDOWN VOLTAGE PERFORMANCE AND METHOD FOR MANUFACTURING THE SAME

BACKGROUND OF THE INVENTION

1. Field of the Invention:

The present invention relates generally to semiconductor devices including but not limited to metal oxide semiconductor field effect transistors (MOSFETs). More particularly, but not exclusively, this invention relates to MOS type semiconductor devices excellent in withstanding or breakdown voltage performance and a method for manufacturing the same.

2. Description of Related Art:

One known MOSFET manufacturing method is shown in FIGS. 2A–2E. As shown in FIG. 2A, a silicon oxide film 22 is arranged on a silicon substrate 21 for later use as a gate oxide layer. Then, a polysilicon layer 23 is arranged on the oxide film. Next, a patterned resist layer 24 for use during formation of a gate electrode pattern is formed on a part of the polysilicon layer 23 which will later become a gate electrode.

Thereafter, as shown in FIG. 2B, the polysilicon layer 23 is etched with the resist layer 24 being used as a mask therefor, thereby forming a polysilicon gate electrode 23'.

Next, as shown in FIG. 2C, low-concentration ion implantation 27 of a selected impurity, such as boron or phosphorus, is performed to thereby obtain lightly-doped source/drain regions 29.

Thereafter, as shown in FIG. 2D, additional or "extra" oxidation, called low-temperature oxidation (LTO), is carried out for recovery of any possible etching damages which arose during formation of the gate electrode 23' and damages resulting from the ion implantation 27. The ion implantation may alternatively be done after the LTO. Through this LTO, exposed portions of the oxide film 22 are forced to additionally grow to thereby form a thickened oxide film 22' with an increased thickness--- to obtain what is called an oxide thick-film while also permitting formation of an oxide film 25 at exposed part of the gate electrode 23'. On the contrary, the gate oxide layer underlying the gate electrode 23' does not grow and thus retains the gate oxide layer 22 as originally formed. However, the oxide film immediately beneath the terminate end portions of the gate electrode 23' results in formation of a slightly additionally grown boundary oxide layer in the form that it "bites" into an underpart of the gate electrode 23'. As a result, distortion 26 can take place at or near the end portions of the gate electrode 23' upon receipt of influence from the boundary oxide layer of the underlying oxide film 22' that has been grown slightly. This distortion 26 at the ends of gate electrode 23' causes breakdown voltage defects of MOSFET products.

As shown in FIG. 2E, after having formed lightly-doped drain (LDD) side spacers 28, high-concentration ion implantation is performed to thereby manufacture a MOSFET product.

As stated above, the MOSFET manufactured by the above-described prior art method is faced with a problem that the distortion 26 can occur at ends of the gate electrode 23, due to additional oxidation growth at the boundary part of the gate oxide film 22' at the additional oxidation step of FIG. 2D, which can cause breakdown voltage defects. This is a serious bar to successful manufacture of MOS type semiconductor devices, especially those MOSFETs with middle-class breakdown voltage performance ranging from ten volts up to several tens of volts or ones with high-class breakdown voltage performance of a hundred of volt or higher.

Another problem associated with the above-described prior art manufacturing method is that it requires a specific process step of forming the LDD side spacers 28 prior to the high-concentration ion implantation, which would result in an increase in the number of process steps involved.

A further problem faced with the above-described prior art manufacturing method is that the setting of process conditions makes it difficult to employ desired high-melting-point metals, so-called refractory metals, other than polysilicon-this is the currently "standard" material for use as the gate electrode-including molybdenum and tungsten for example.

SUMMARY OF THE INVENTION

It is therefore one primary object of the present invention to provide a MOS type semiconductor device with a gate oxide layer formed of a silicon oxide film capable of offering enhanced breakdown voltage performance at terminate ends of a gate electrode.

It is another object of this invention to provide a method for manufacturing a MOS semiconductor device with stable and excellent breakdown voltage performance through relaxation of distortion otherwise occurring due to oxidation growth of a gate oxide layer.

It is yet another object of the invention to provide a method of manufacturing a MOS semiconductor device having similar effects while avoiding the necessity of forming LDD side spacers thus reducing or simplifying the overall fabrication procedure.

It is still another object of the invention to provide a MOS semiconductor device manufacturing method which permits the use of high-melting-point metals, including but not limited to molybdenum or tungsten, other than polysilicon as currently widely employed as the gate electrode material.

To solve the above-noted problems, the manufacturing method incorporating the principles of the invention is specifically arranged to fabricate a gate electrode after completion of a process step of additionally oxidizing an oxide film to ensure that the gate electrode is no longer directly affectable from any oxide film under additional oxidation growth, which in turn makes it possible to eliminate distortion at terminate end portions of the gate electrode.

More specifically, the method includes the steps of forming on a semiconductive substrate an oxide film for use as a gate oxide layer, disposing a shield body at a gate electrode formation location on the oxide film, letting the oxide film additionally grow through oxidation, removing the shield body after such additional growth, and forming a gate electrode at a specified part from which the shield body has been removed away.

Another feature unique to the MOS semiconductor device manufacturing method in accordance with the invention is that it permits the use of selected materials other than polysilicon, such as for example high-melting-point molybdenum or tungsten, for fabrication of the intended gate electrode after additional growth of the oxide film.

A further feature of the MOS semiconductor device manufacturing method in accordance with the invention is that low-concentration ion implantation is performed upwardly from the shield body and oxide film, high-concentration ion implantation is done by use of contact holes as defined in an interlayer dielectric layer that covers both the gate electrode and the oxide film whereby the intended MOS semiconductor device with the same effects is obtainable while omitting the step of forming LDD side spacers.

In accordance with the invention, a MOS semiconductor device is also provided wherein the terminate ends of a gate electrode are free from any distortion otherwise occurring due to additional oxidation growth of an oxide film while these gate ends are placed at locations overlying the thickened oxide film as formed through such additional growth to have an increased thickness. Accordingly, the gate electrode may stably offer excellent breakdown voltage performance, resulting in achievement of the MOS semiconductor device having stable breakdown voltage performance.

BRIEF DESCRIPTION OF THE DRAWINGS

FIGS. 2A, 2B, 2C, 2D, and 2E are process step diagrams showing a prior art MOS semiconductor device manufacturing method.

DETAILED DESCRIPTION OF THE INVENTION

An explanation will now be given of one preferred embodiment of the present invention with reference to FIGS. 1A, 1B, 1C, 1D and 1E.

Figure 1A:
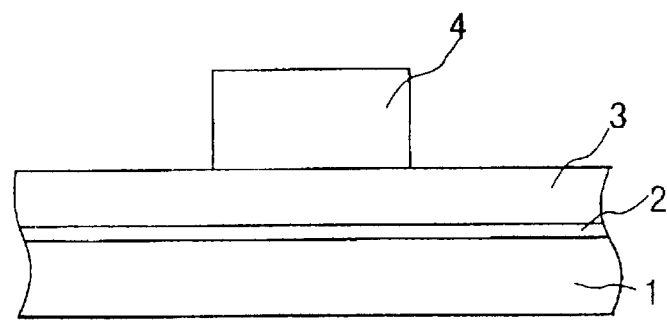
FIGS. 1A, 1B, 1C, 1D and 1E are process step diagrams showing a method for manufacturing a MOS type semiconductor device in accordance with the present invention.

As shown in FIG. 1A, on a silicon substrate 1, a silicon oxide film 2 is formed for later use as a gate oxide layer. Then, on this oxide film 2, a nitride film 3 is arranged. As shown herein, a patterned resist layer 4 is formed and disposed on the nitride film 3 at a specified location corresponding to the position at which a gate electrode will later be formed.

Figure 1B:
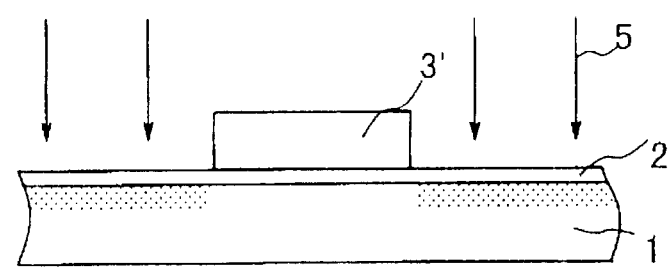

Next, as shown in FIG. 1B, the patterned resist layer 4 is used to selectively remove the nitride film 3 to thereby permit a nitride film pattern 3' to reside only at a location whereat the gate electrode is to be formed. This nitride film pattern 3' will later be subjected to selective oxidation. To form lightlydoped source/drain regions 7, low-concentration ion implantation 5 is performed using a chosen impurity, for example, boron or phosphorus.

Figure 1C:
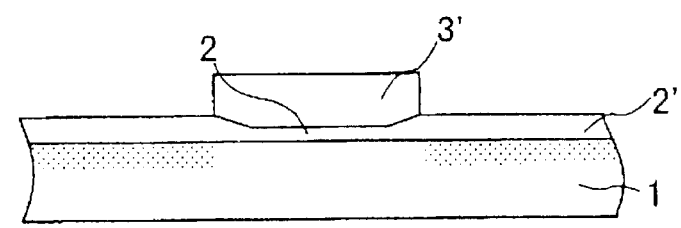

Further, as shown in FIG. 1C, for the purposes of the recovery of damages occurred during the ion implantation 5 and thick-film fabrication of the oxide film 2 at a part other than the gate oxide layer, additional or "extra" oxidation corresponding to the low temperature oxidation (LTO) in the prior art is applied to the oxide film 2 thus letting it additionally grow selectively to thereby form a "thickened" oxide film 2' with its thickness increased, what is referred to as an oxide thick-film. At this time, the oxide film 2 for use as the gate oxide layer immediately underlying the nitride film pattern 3' remains free from oxidation and thus retains its original thickness. The oxide film 2 beneath the opposite end portions of the nitride film pattern 3' is permitted to exhibit slight additional oxidation growth, resulting in the formation of a boundary oxide layer having its thickness that is intermediate in value between those of the gate oxide layer and the oxide thick-film 2'. Optionally, the low-concentration ion implantation of FIG. 1B may be done after completion of this additional oxidation process in accordance with whatever process design is used.

Figure 1D:
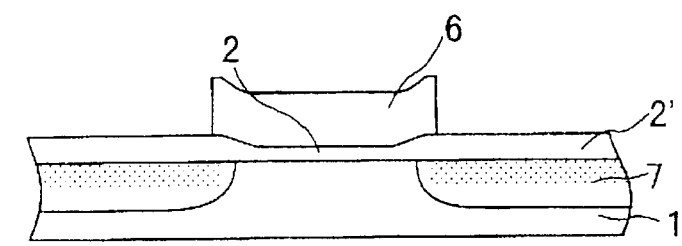

Next, as shown in FIG. 1D, the nitride film pattern 3' is removed for selective oxidation; then, a gate electrode 6 is formed at the location from which such pattern has been removed away. The gate electrode 6 is disposed or "multi-layered" on the oxide film 2' as additionally grown through extra oxidation and the gate oxide layer 2 that does not undergo any extra oxidation. The gate electrode 6 has its opposite terminate end portions which extend beyond the boundary layer having a thickness intermediate in value between those of the gate oxide layer 2 and the oxide thick-film 2' to be disposed on the oxide thick-film 2'. As the gate electrode 6 is fabricated after completion of the oxidation process shown in FIG. 1C in the manner described above, it remains free from any direct influence from the oxide film 2' under extra-oxidation growth, Thus, unlike the prior art described above, distortion no longer takes place at or near the terminate ends of the gate electrode 6. In addition, since the terminate ends of gate electrode 6 are disposed on the oxide thick-film 2', the breakdown voltage performance is improved at these ends of the gate electrode 6. Although the ends of the gate electrode 6 are extended up to the oxide thick-film 2', such portions of gate electrode 6 on the oxide thick-film 2' will hardly affect a transistor operation of the resultant MOSFET. The effective or "net" length is determinable by the significance of the gate electrode 6 on the gate oxide layer 2 with a thin layer thickness. Furthermore, as the formation of gate electrode 6 is done after the thick-film growth of the oxide film 2', the gate electrode material used should not be limited only to polysilicon and may alternatively be high-melting-point metals including molybdenum or tungsten or other similar suitable materials.

Figure 1E:
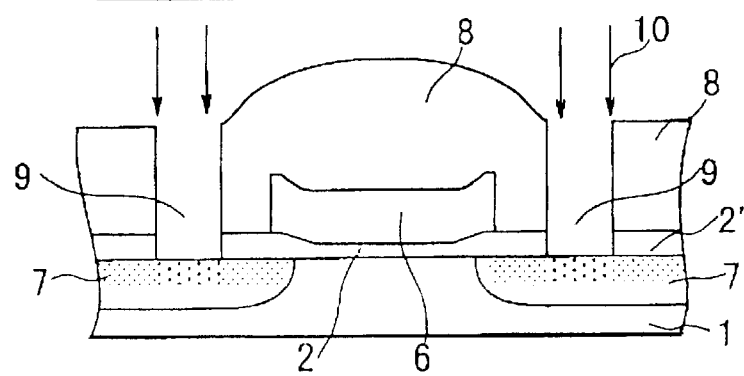

As shown in FIG. 1E, an interlayer dielectric film 8 for formation of a wiring layer or layers is formed covering the gate electrode 6 and the oxide thick-film 2'. Contact holes 9 leading to the source/drain regions are defined in the interlayer dielectric film 8. With these contact holes 9, high-concentration ion implantation 10 is performed using for example boron or arsenic to form heavily-doped source/drain regions. While the heavily-doped source/drain regions are formed without use of any known LDD spacers, the intended structure of lightly-doped drain region 7 is successfully fabricated, which is similar to the one that employs related art LDD spacers. Consequently, it becomes possible to omit the process step of forming such LDD spacers, which step has been inevitable in the prior art.

As shown in FIG. 1E, the silicon substrate 1 has a channel between the drain and source regions 7 as known in the art. Further, as shown in FIGS. 1A–1E, it should be noted that the upper surface of the substrate (that surface on which the oxide layer 2 is arranged) is planar and that the source/drain regions 7 are spaced from one another in a lateral direction of the substrate 1 with the channel being situated therebetween. The gate electrode 6 thus extends from over a part of the source region 7, over the entire channel and over a part of the drain region 7.

It has been stated that according to the MOS semiconductor device and its manufacturing method of the present invention, gate electrode end portions are associated with no or at least greatly suppressed distortion while being disposed on or over the thickened oxide film, which makes it possible to constitute the intended middle-class or high-class breakdown voltage MOS semiconductor device of good quality with its withstanding or breakdown voltage performance stably improved while at the same time enabling successful manufacture thereof. In addition, according to this invention, it is possible to employ as the material for the gate electrode high-melting-point metallic materials including molybdenum and tungsten and others in addition to polysilicon without any strict limitation thereto. Furthermore, according to the invention, a similar structure to those employing LDD spacers is manufacturable without using such LDD spacers, which in turn provides excellent advantages such as an ability to omit the process step(s) corresponding thereto.

What is claimed is:

1. A MOS semiconductor device, comprising:
   a semiconductive substrate including source and drain regions spaced from one another in a lateral direction along said substrate and a channel arranged between said source and drain regions;
   a gate electrode arranged over said substrate; and
   an oxide layer arranged on said substrate and consisting essentially of a gate oxide layer arranged between said gate electrode and said substrate, an oxide film having a thickness greater than a thickness of said gate oxide layer and a boundary oxide layer situated between said gate oxide layer and said oxide film and having a thickness intermediate in value between the thickness of said gate oxide layer and the thickness of said oxide film,
   wherein said oxide film and said boundary oxide layer are formed by a selective oxidation before formation of said gate electrode; and
   wherein said gate electrode has terminate end portions extending beyond said boundary oxide layer over a portion of said oxide film while receiving no distortion from said boundary oxide layer to thereby improve breakdown voltage performance at the end portions of said gate electrode.

2. The MOS semiconductor device as recited in claim 1, wherein said substrate includes heavily-doped source/drain regions formed by high-concentration ion implantation obtained through a plurality of contact holes in an interlayer dielectric layer.

3. The MOS semiconductor device as recited in claim 1, wherein an upper surface of said substrate on which said oxide layer is arranged is planar.

4. The MOS semiconductor device as recited in claim 1, wherein said oxide layer extends from said source region to said drain region.

5. The MOS semiconductor device as recited in claim 1, wherein said gate electrode is multilayered on said gate oxide layer and made of a nitride film.

6. The MOS semiconductor device as recited in claim 1, wherein said gate electrode is made of molybdenum or tungsten.

7. The MOS semiconductor device as recited in claim 1, wherein said gate electrode extends over a part of said source region and over a part of said drain region.

8. The MOS semiconductor device as recited in claim 1, wherein the thickness of said oxide film is greater than the thickness of said gate oxide layer in view of growth of said oxide film through said oxidation.

9. The MOS semiconductor device as recited in claim 1, wherein said boundary oxide layer is arranged entirely between said substrate and said gate electrode.

10. The MOS semiconductor device as recited in claim 1, wherein said oxide film is only partially arranged between said substrate and said gate electrode.

11. The MOS semiconductor device as recited in claim 1, further comprising a dielectric film covering said oxide film and said gate electrode.

12. The MOS semiconductor device as recited in claim 11, wherein said dielectric film includes contact holes leading to said substrate.

13. A MOS semiconductor device, comprising:
    a semiconductive substrate including source and drain regions spaced from one another in a lateral direction along said substrate and a channel arranged between said source and drain regions;
    an oxide layer arranged on said substrate and extending from said source region to said drain region, said oxide layer consisting essentially of a gate oxide layer having a thickness, an oxide film having a thickness greater than the thickness of said gate oxide layer and a boundary oxide layer arranged between said gate oxide layer and said oxide film and having a thickness between the thickness of said gate oxide layer and the thickness of said oxide film; and
    a gate electrode arranged entirely over said gate oxide layer and said boundary oxide layer and having end portions arranged over said oxide film;
    whereby said oxide film and said boundary oxide layer are formed by a selective oxidation before formation of said gate electrode.

14. The MOS semiconductor device as recited in claim 13, wherein said gate electrode is made of molybdenum or tungsten.

15. The MOS semiconductor device as recited in claim 13, wherein said gate electrode extends over a part of said source region and over a part of said drain region.

16. The MOS semiconductor device as recited in claim 13, wherein said gate electrode is made of a nitride film.

17. The MOS semiconductor device as recited in claim 13, wherein the thickness of said oxide film is greater than the thickness of said gate oxide layer in view of growth of said oxide film through said oxidation.

18. The MOS semiconductor device as recited in claim 13, further comprising a dielectric film covering said oxide film and said gate electrode.

19. The MOS semiconductor device as recited in claim 18, wherein said dielectric film includes contact holes leading to said substrate.

20. The MOS semiconductor device as recited in claim 13, wherein an upper surface of said substrate on which said oxide layer is arranged is planar.

* * * * *